United States Patent [19]
Klein et al.

[11] 3,869,681

[45] Mar. 4, 1975

[54] MICROWAVE CAVITY OSCILLATOR HAVING A FREQUENCY TUNING ELEMENT

[75] Inventors: Carl F. Klein; Lawrence B. Korta; James R. Bailey, all of Milwaukee, Wis.

[73] Assignee: Johnson Service Company, Milwaukee, Wis.

[22] Filed: Aug. 30, 1972

[21] Appl. No.: 285,048

[52] U.S. Cl. .............................. 331/96, 331/107 R

[51] Int. Cl. .............................................. H03b 7/12

[58] Field of Search .............. 331/96, 107 R, 107 G

[56] References Cited

UNITED STATES PATENTS

| | | | |
|---|---|---|---|
| 3,512,105 | 5/1970 | Lance, Jr. et al. | 331/96 |
| 3,624,555 | 11/1971 | Klein | 331/96 |
| 3,688,219 | 8/1972 | Havens | 331/96 |

*Primary Examiner*—John Kominski

*Attorney, Agent, or Firm*—Andrus, Sceales, Starke & Sawall

[57] ABSTRACT

An open ended microwave cavity oscillator comprises a microwave diode forming part of a coaxial center conductor secured to the cavity's base wall. A tuning rod of low loss dielectric material is threaded into the cavity to capacitively tune the oscillator's frequency. A varactor diode is mounted within the center of the tuning rod and is connected between an external supply voltage and ground via a ground wire which projects out of the rod and is bent rearwardly to constitute a coupling loop. The varactor diode is connected to a voltage supply for frequency tuning and modulation of the oscillator output.

14 Claims, 7 Drawing Figures

MICROWAVE CAVITY OSCILLATOR HAVING A FREQUENCY TUNING ELEMENT

BACKGROUND OF THE INVENTION

This invention relates to a microwave cavity oscillator having a frequency tuning element and particularly to such an oscillator employing a solid state active element in combination with a frequency tuning element which electrically varies the capacitive loading of the cavity.

Generally, a microwave solid state fundamental frequency cavity oscillators are desirably frequency tunable. For example, U.S. Pat. No. 3,624,555 discloses a highly satisfactory dielectric tuning element adjustably mounted within the open end of a cavity oscillator. The dielectric tuning element provides an adjustable capacitive loading of the open ended coaxial cavity with the effective cavity impedance and the frequency of the oscillator responsive to the projection of the element into the cavity to thereby control the oscillator output without loading of the cavity. Various mechanical systems have also been suggested for changing the cavities dimension of the oscillator cavity's circuit. Such systems often result in significant power losses as well as mechanically complex apparatus to provide proper changes in the cavity geometry. Other systems for cavity tuning employ electrically biased solid state devices, particularly YIG (yttrium-iron-garnet) devices which utilize the magnetic field properties of such a device. This requires the use of electromagnets with their undesirable added weight and complexity as well as power consumption. Further YIG devices have a limited tuning range and the magnetic field properties introduce at least some hysteresis. More recently varactor diodes have been coupled to oscillator cavities for frequency tuning. However, they have generally been limited to oscillators which experience a change in frequency with load impedance and have not provided broad band frequency tuning with constant output power. Further, present commercial sources generally have relatively low yield factors and the components employed are selected with relataively close tolerances on the parameters since the significantly impedance cannot be altered significantly to establish the necessary conjugate impedance required for oscillation in solid state cavity oscillators.

As a generaly statement, present day microwave power sources may be described as being relatively complex with a correspondingly difficult construction and significant expense. There remains therefore a need for a tunable cavity oscillator which will maintain high Q and yield factors with a constant output power and frequency over a relatively wide variation in temperature and load impedance.

SUMMARY OF THE PRESENT INVENTION

The present invention is particularly direcited to a microwave oscillator employing a voltage variable capacitive tuning means which provides broad band tuning while maintaining desirable high Q and yield factor with constant output power and frequency over a significant variation in temperature and load impedance. Generally, in accordance with the present invention, a variable voltage capacitor such as a varactor diode is coaxially mounted within a dielectric element mounted in the end opposite the cavity's base. The varactor diode capacitively loads the open ended cavity in accordance with the voltage bias supplied to the diode and thus provides an electrically responsive variable capacitance loading of the cavity. The oscillator output is controlled by the impedance of the solid state oscillator diode and the conjugate impedance provided by the cavity, with the cavity's impedance dependent turn at least in part upon the variable voltage capacitor.

In accordance with a particularly novel aspect of the present invention, a varactor diode is coaxially mounted within a dielectric tuning element which, in turn, is threaded into the cavity for axial adjustment within the cavity. The dielectric tuning element results in a direct capacitive coupling of the open ended cavity to the center conductor to provide tuning without loading of the cavity. The varactor diode is mounted in insulated relationship within the tuning element with an input lead extending outwardly and terminating in a suitable voltage supply terminal. The opposite end of the diode is connected to a ground wire which, in turn, extends outwardly of the dielectric element and backwardly to define a coupling loop with the outer end interconnected to the ground portion of the cavity. Thus, the loop coupling does not vary with the rotation of the dielectric element since the flux linkage of the loop is independent of the rotational position.

This construction is also particularly adapted to existing solid state microwave oscillators and particularly those such as shown in U.S. Pat. No. 3,624,555 since the invention can be adapted to such existing units by a simple tuning element replacement.

The varactor can be connected to a suitable dc bias supply or signal source to provide any one of a desired number of different forms of tuning, for example, imposing diplexing or pulsed AM-FM modulation tuning of a base frequency and continuous AM and FM modulation.

The present invention thus provides a relatively simple and inexpensive construction of an electrically responsive variable capacitive tuned microwave oscillator which permits high efficiency of operation with low AM and FM noise characteristics.

BRIEF DESCRIPTION OF DRAWING

The drawing furnished herewith illustrates a preferred construction of the present invention in which the above advantages and features and clearly disclosed as well as others which will be readily understood from the following description of such illustrated embodiment.

In the drawing.

DESCRIPTION OF ILLUSTRATED EMBODIMENT

Figure 1:
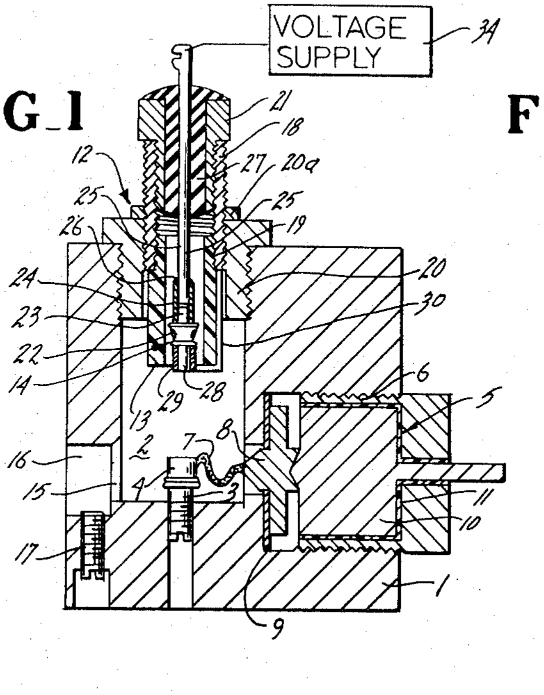
FIG. 1 is a vertical section through a solid state microwave cavity oscillator incorporating the tuning construction of the present invention.
Figure 2:
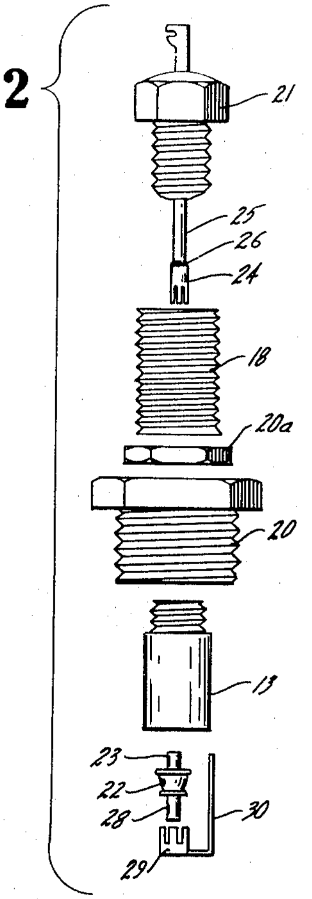
FIG. 2 is an exploded pictorial view of the microwave cavity oscillator tuning element shown in FIG. 1.

Referring to the drawing and particularly to FIGS. 1 and 2, the present invention is shown applied to a microwave oscillator generally including a rectangular cavity block 1 with an open ended cylindrical oscillator cavity 2 extending inwardly from the one wall and terminating in a mounting base. A solid state diode unit 3 is mounted in the closed end of the cavity 2 as by being threaded within a suitable tapped opening in the base wall of the cavity. A coaxial center conductor 4 is connected to the diode in any suitable manner, s by a slotted press fit and projects coaxially outwardly with the length of the coaxial center conductor 4 selected such that the reactive impedance at the outer end complements the negative impedance characteristic of the solid state diode unit 3. Bias voltage and current are supplied to the diode unit 3 through a coupling connecting assembly 5 which is mounted in a laterally extended recess in the wall of the rectangular block 1. The illustrated assembly 5 corresponds to that shown in U.S. Pat. NO. 3,624,555 and includes a bias conductor 7 which is formed with a loop to introduce an inductive impedance in the bias connection to the coaxial conductor 4. The conductor 7 is connected to an input metal disc 8 within the recess and which is insulated from the adjacent wall of the cavity body by a capacitive dielectric medium or element 9. Disc 8 is clamped in position by a center bias pin 10 which is secured within the recess 6 by a suitable plug member 10*a* and insulated therefrom by a suitable high frequency bypass insulator 11. The frequency of the microwave oscillator is controlled by a tuning rod assembly 12 selectively positioned in the open end of the cavity 2. Generally, the illustrated assembly 12 includes a tuning element 13 of a dielectric material which functions to tune the No. oscillator in accordance with the teaching of U.S. Pat. NO. 3,624,555. In addition and in accordance with the teaching of the present invention, a special voltage variable capacitor assembly 14 is mounted within the tuning element 13 and is connected into the circuit of the cavity oscillator to provide additional tuning capability as more fully developed hereinafter. The output of the microwave oscillator is coupled through a small iris or opening 15 adjacent the base portion of the cavity 2 to a coupling impedance transformer 16. A small tuning rod 17 may be mounted for selected lateral projection into the transformer cavity 16 to permit adjustment of the coupling for optimum power transfer characteristics.

Thus the illustrated embodiment of the invention generally corresponds to that disclosed in the previously referred to U.S. Pat. No. 3,624,555 and in particular employs the low loss dielectric tuning element which directly changes the coaxial center conductor coupling and capacitance at the open end of the cavity by changing the dielectric constant. The degree of coupling is adjusted and controlled by the relatively axial positioning of the dielectric tuning element 13 to provide an improved frequency tuning means.

The present invention is particularly directed to the addition of the voltage variable capacitor assembly 14 to the open end of the cavity with the preferred construction shown in FIGS. 1 and 2.

More particularly the tuning assembly 12 includes a tubular metal support member 18 which is internally and externally threaded. The tubular dielectric element 13 is provided with an upper reduced portion which is correspondingly threaded and interconnected to the lower end of the tube 18, as at 19. The tube 18, in turn, is threaded into an annular plug 20 which threads into the cavity 2 to thereby adjustably support the tubular element 13 within the cavity 2. A locking nut 20*a* may be provided for the locking of the member 18 in a set position. An outer nut portion 21 is threaded into the member 18 and supports the new voltage variable capacitor assembly within the tubular dielectric element 13.

In accordance with the illustrated embodiment of the present invention, the voltage variable capacitor assembly 14 includes a varactor diode 22 located in the lower end of the member 13. The diode 22 includes an outwardly projecting mounting stud 23 with a slitted hat 24 press fitted thereto and interconnected to a tubular terminal 25 as by silver solder 26 or the like. The terminal 25 projects outwardly through the dielectric element 13 and the supporting tube 18 including its outer adjustment cap or nut 21 for selected connection to a suitable voltage control means. The terminal 25 is attached to the nut 21 by a suitable insulator 27 defining a feed through capacitance with respect to the tube 18 and cavity block or housing 1.

A ground connecting stud 28 projects from the opposite end of the diode 22 with a slitted hat 29 press fitted thereon. A ground wire 30 is soldered or otherwise secured to the slitted hat 29 and extends about the innermost end of the element 13 and then backwardly along the element 13 to the tube 18 to which it is suitably connected to establish a ground connection.

The voltage applied to the diode terminal 25 determines the capacitance which thereby defines a variable capacitive impedance device. The location within the dielectric center conductor or element 13 provides a very convenient and efficient coupling of this variable impedance into the oscillator cavity.

Figure 3:
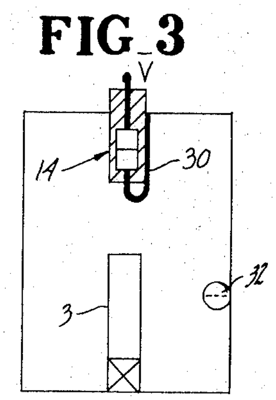
FIG. 3 is a diagrammatic illustration of the present varactor tuning coupling and a conventional loop coupling.
Figure 4:
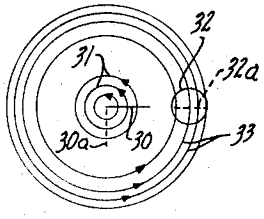
FIG. 4 is a horizontal section of the coupling system shown in FIG. 3.

The coupling or ground wire 30 connected about the element 13 provides a coupling which is essentially independent of the angular orientation of the tuning assembly. Thus, referring particularly to FIGS. 3 and 4, the tuning assembly 14 and the diode 3 are diagrammatically illustrated as mounted within a common cavity with the ground wire 30 shown as a small coupling loop. The flux line adjacent the loop 30 are more clearly shown in FIG. 4 as at 31. As shown by the full line illustration of the wire 30, and the dotted line illustration at 90° thereto as at 30*a*, the flux lines enclosed remain the same for all angular orientation of the loop. In contrast, the conventional sidewall loop 32 as shown in full line, and in dotted line illustration at 90° thereto as at 32*a*, encompasses the flux lines 33 in a varying manner and in accordance with the angular or rotational orientation of the loop 32 within the cavity. Thus the sidewall 32 establishes coupling which varies between a maximum when the loop is at right angles to the flux lines to a zero coupling when the plane of the coupling loop lies in the plane of the magnetic flux lines.

The capacitive loading of the open ended cavity and in particular the coupling of the coaxial center conductor 4 is determined by the insertion depth of the varactor diode 22 and the associated tuning element 13 into the cavity in combination with the voltage applied across the tuning varactor diode 22. The axial positioning of the assembly 12 within the cavity establishes frequency adjustment as a result of the varying of the projection of the tuning element into the cavity. The output frequency can also be adjusted by applying an appropirate voltage signal on the terminal 25 from a suitable voltage bias source 34 or the like. This combination provides a highly efficient and reliable approach to coaxial cavity frequency selection which permits broad band frequency tuning and/or oscillator modulation with essentially constant output power.

Figure 5:
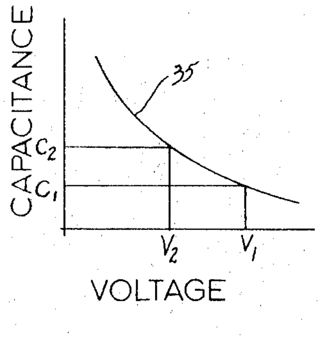
FIG. 5 is a graphical illustration showing the voltage versus capacitor characteristic of a varactor diode.

Referring particularly to FIG. 5, the varactor diode characteristic with varying input voltage is illustrated by the curve 35. The capacitance varies inversely with the voltage. The frequency, in turn, varies inversely with the capacitance and thus directly with the voltage. The direct current (D.C.) voltage applied to the varactor diode thus provides a means for finely adjusting the frequency. For example, a series of oscillators may be selectively tuned to stagger the outputs and avoid unit interaction. Such a system could be formed with a fixed varactor supply voltage connected to the varactor diode through a suitable switched resistance bank with each of the resistance insertions connected to correspond to a particular operating frequency.

Figure 6:
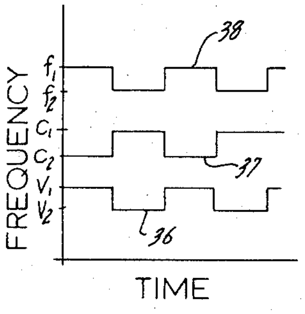
FIG. 6 is a graphical illustration showing the result of switching of the voltage bias on the varactor diode to generate two different frequency signals.
Figure 7:
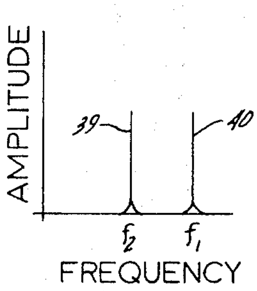
FIG. 7 illustrates the resulting frequency spectrum.

FIGS. 6 and 7 illustrate the application of this invention to diplexing to produce a pair of alternately transmitted frequencies. The voltage source 34 of FIG. 1 is assumed to be a variable voltage source which switches between two distinct DC voltage values as shown by the curve 36. This results in a corresponding inverse capacitance variation as shown by curve 37. These two impedance values correspondingly switch the microwave output to establish the two distinct frequency outputs as shown by the curve characteristics 38 in FIG. 6. The voltage source 34 can be readily constructed to rapidly and abruptly switch between the two voltage levels. This, in turn, results in a rapid and correspondingly abrupt switch in the discrete capacitance of the diode and the capacitive loading of the cavity oscillator, and thereby establishes a corresponding microwave frequency change. The response of the modulator to the pulse excitation is shown in FIG. 7 by the two frequencies 39 and 40.

In addition to such diplexing the system can also be applied to otherwise tune the circuit by the use of an appropriate bias voltage. For example, in an intrusion detection apparatus and the like employing microwave energy fields, it is highly desirable to "supervise" the system by use of a modulated transmitter, for example, as discussed in the pending U.S. application, Ser. No. 805,591 of Bailey, et al., filed on Mar. 10, 1969 entitled "INTRUSION DETECTION APPARATUS HAVING SUPERVISORY CONTROL MEANS." The supervisory signal may be created by imposing a small amount of modulation upon the microwave carrier, with continuous detection in the receiver circuitry of the modulation signal. If there is any change or loss of the modulation signal there is an immediate indication of system malfunction. With the present invention, the varactor diode can be loosely coupled to the cavity and driven by an appropriate modulating frequency signal generator to introduce the corresponding modulation of the output frequency. A similar construction could, of course, be applied where the modulation signal was an audio-frequency or digitally coded information source or some other specialized periodic wave form source, such as a triangular of square-wave signal which is superimposed on the high frequency carrier and creates a modulated signal which may be readily detected by suitable receiving means.

In these and other similar applications, the voltage on the varactor diode thus provides an overriding tuning mechanism.

This form of modulation can, of course, also be approached by modulating the bias voltage applied to the active element of the oscillator. However, such active devices have imposed certain limitations upon the tuning as heretofore discussed. Further, if high frequency modulating signals are employed, the conventional power supply circuitry and bias oscillation circuits produce undesirable interaction with the modulation signal. These disadvantages are not encountered with the present invention.

The present invention thus provides a solid-state microwave oscillator having significantly improved tuning capabilities. The present invention can be readily constructed and manufactured with a minimum expense and applied without loss of the desirable "Q" factor and efficiency associated with optimum operating characteristics.

Various modes of carrying out the invention are contemplated as being within the scope of the following claims, particularly pointing out and distinctly claiming the subject matter which is regarded as the invention.

We claim:

1. A microwave cavity oscillator tuning element for tuning of the cavity frequency of a cavity oscillator comprising a dielectric tuning means movably mounted within a cavity opening of said cavity oscillator and having an inner end, said dielectric tuning means constituting a first means to tune the cavity frequency, a voltage variable capacitor means mounted for movement with said dielectric tuning means and having an input terminal means and a coupling conductor means extending from the inner end of the dielectric tuning means, said variable capacitor means constituting a second means to further tune the cavity frequency.

2. The microwave cavity oscillator tuning element of claim 1 wherein said dielectric tuning means is rotatably mounted within the opening, and said coupling conductor means is looped rearwardly over the inner end of the dielectric tuning means to establish a coupling independently of the angular orientation of the conductor means.

3. The tuning element of claim 1 wherein said variable capacitor is a varactor diode.

4. A microwave cavity oscillator tuning element comprising a dielectric tuning means including an outer mounting means for adjustable mounting of the dielectric tuning means within a cavity opening with an inner end within the cavity and constituting a first means for substantially tuning the cavity frequency, a varactor diode means located within said dielectric tuning means and having an input terminal means extending outwardly of the dielectric tuning means and a coupling conductor means extending out of the inner end of the dielectric tuning means, and said diode means constituting a second means for substantially tuning the cavity frequency.

5. The tuning element of claim 4 wherein said dielectric tuning means includes an outer tubular element defining a ground means and said diode means includes oppositely projecting end studs extending coaxially of the tuning means, said terminal means including a first connector connected to the one stud and projecting outwardly coaxially of the tuning means, a support member aligned with the outer end of the connector and rotatably mounted into said tuning element, insulating means attaching said connector to said support member, and said coupling conductor extending back along the exterior of the dielectric tuning means and connected to said tubular element.

6. The tuning element of claim 4 wherein said dielectric tuning means includes a tubular dielectric element and an outer tubular pipe member having internal and external mounting threads and being threaded onto one end of said dielectric element, said diode means being located within the inner end of the tuning element, and including a mounting plug threaded to said tubular pipe member and connected to support said diode means.

7. The tuning element of claim 4 wherein said diode means is located within the inner end of the dielectric tuning means and includes oppositely projecting end connections, said input terminal means including a connector attached to one connection and projecting outwardly coaxially of the dielectric tuning means, a supporting member aligned with the outer end of the connector and including an insulating means attached to said connector to define a feed through capacitive mounting of said connector to said dielectric tuning means.

8. A solid state microwave cavity oscillator for generating microwave energy comprising, a microwave cavity housing having an open-ended cavity, a microwave diode means secured in the lower end of the cavity, a dielectric tuning element adjustably mounted in the open end of said cavity in spaced, coupled relationship to said diode means for substantially tuning the frequency of the oscillator and establishing a base frequency of the oscillator, and a varactor diode mounted within the inner end of the tuning element and having an input terminal means for selectively electrically controlling and fine tuning of the frequency of the oscillator with respect to said base frequency.

9. The cavity oscillator of claim 8 wherein said varactor diode includes oppositely projecting end terminals, a first connector secured to one terminal end projecting outwardly to define a voltage input terminal means, an insulating means attaching said connector to said housing to define a bypass capacitive mounting, and a coupling conductor secured to the second terminal and extending back along the exterior of the element and connected to said housing to define a diode coupling loop.

10. The cavity oscillator of claim 9 wherein said dielectric tuning element is rotatably mounted about an axis normal to the plane of the magnetic field within the cavity such that the coupling is independent of the angular orientation of the coupling loop.

11. The microwave cavity oscillator of claim 8 including a power supply of fixed amplitude output and a variable coupling between the supply and the input means for fine tuning of the oscillator frequency.

12. The microwave cavity oscillator of claim 8 including a power supply connected to said input terminal means, the output amplitude of said power supply varying in a preselected sequence to correspondingly modulate the oscillator frequency.

13. The microwave cavity oscillator of claim 8 including a power supply connected to said input terminal means and establishing time spaced direct current signals of different amplitude to create a diplex output of two preselected frequencies.

14. The tuning element of claim 8 wherein said dielectric tuning means includes a tuning dielectric element attached to an outer conductive element defining a ground connection, and a coupling connector extending back along the exterior of the dielectric element and connected to said conductive element.

* * * * *

UNITED STATES PATENT OFFICE

CERTIFICATE OF CORRECTION

PATENT NO. : 3,869,681

DATED : March 4, 1975

INVENTOR(S) : CARL F. KLEIN ET AL

It is certified that error appears in the above-identified patent and that said Letters Patent are hereby corrected as shown below:

Column 1, Line 22, after "the" cancel "cavities" and insert --- physical ---;

Column 1, Line 43, before "impedance" cancel "significantly" and insert --- cavity ---;

Column 2, Line 6, after "dependent" insert --- in ---;

Column 2, Line 46, after "features" cancel "and" and insert --- are ---;

Column 3, Line 10, before "by" cancel "s" and insert --- as ---;

Column 3, Line 35, at the beginning of the line, cancel "No." and insert --- cavity ---;

Column 3, Line 36, after "of" cancel "Pat. NO." and insert --- Patent ---;

Signed and Sealed this

*fifth* Day of *August 1975*

[SEAL]

*Attest:*

RUTH C. MASON
*Attesting Officer*

C. MARSHALL DANN
*Commissioner of Patents and Trademarks*